(12) United States Patent
Moriya et al.

(10) Patent No.: US 6,937,631 B2
(45) Date of Patent: Aug. 30, 2005

(54) SEMICONDUCTOR LASER DEVICE

(75) Inventors: Hiroshi Moriya, Chiyoda (JP); Kisho Ashida, Chiyoda (JP); Toshinori Hirataka, Yokohama (JP); Mamoru Morita, Hiratsuka (JP)

(73) Assignees: Hitachi, Ltd., Tokyo (JP); OpNext Japan, Inc., Yokohama (JP)

( * ) Notice: Subject to any disclaimer, the term of this patent is extended or adjusted under 35 U.S.C. 154(b) by 237 days.

(21) Appl. No.: 10/358,279

(22) Filed: Feb. 5, 2003

(65) Prior Publication Data

US 2003/0179795 A1 Sep. 25, 2003

(30) Foreign Application Priority Data

Mar. 20, 2002 (JP) ........................................ 2002-078443

(51) Int. Cl.[7] .............................................. H01S 5/00
(52) U.S. Cl. ........................................ 372/43; 372/46
(58) Field of Search ...................... 372/43–50; 257/417

(56) References Cited

U.S. PATENT DOCUMENTS

| | | | | |
|---|---|---|---|---|
| 4,935,935 A | * | 6/1990 | Reed et al. ................... 372/44 |
| 5,561,301 A | * | 10/1996 | Inoue ........................... 257/13 |
| 5,843,486 A | * | 12/1998 | Kurosaki et al. ............ 425/174 |
| 5,903,585 A | * | 5/1999 | Dawson et al. ................ 372/45 |
| 6,744,797 B2 | * | 6/2004 | Kuniyasu et al. ............. 372/43 |
| 2003/0165169 A1 | * | 9/2003 | Nomoto et al. ............... 372/46 |

FOREIGN PATENT DOCUMENTS

| | | |
|---|---|---|
| JP | 2001-210915 | 8/2001 |
| JP | 2001-244568 | 9/2001 |

* cited by examiner

*Primary Examiner*—Minsun Oh Harvey
*Assistant Examiner*—Phillip Nguyen
(74) *Attorney, Agent, or Firm*—Antonelli, Terry, Stout & Kraus, LLP

(57) ABSTRACT

A semiconductor laser device which ensures high yield, high reliability and high power output by reduction in tensile strain in its active region for improvement in the COD level. The device comprises: a semiconductor crystal-growing portion having an active layer for conversion of electric energy into light energy and a mesa structure protruding on the one side; and an electrode film which is electrically connected with the top face of the mesa structure. The electrode film has a tensile strain and stretches sideward from the mesa structure. In the device, there is a strain control film which is polymerized with the electrode film part stretching sideward from the mesa structure and has a compressive stress.

13 Claims, 10 Drawing Sheets

SEMICONDUCTOR LASER DEVICE

FIELD OF THE INVENTION

The present invention relates to a semiconductor laser device and particularly to a semiconductor laser device which has a mesa structure in the semiconductor crystal-growing portion.

BACKGROUND OF THE INVENTION

A conventional semiconductor laser device is described below referring to FIG. 18. FIG. 18 is a front view showing the substantial part of a conventional semiconductor laser device. In the figure, the different types of hatching represent facets; they are intended to help identify different layers and do not represent cross sections.

As shown in FIG. 18, a conventional semiconductor laser device 20 has a first cladding layer, an active layer 3, a second cladding layer 4, and an etching stop layer 5 lie over a semiconductor substrate. Over the etching stop layer 5 is a mesa structure 8 having a third cladding layer 6 and a contact layer 7. The first cladding layer, active layer 3, second cladding layer 4, etching stop layer 5, third cladding layer 6 and contact layer 7 constitute a semiconductor crystal-growing portion 30. There is a dielectric film 10, for example, as a silicon oxide film on the etching stop layer 5 and mesa side faces 9. Furthermore, there is an electrode film 12 on the dielectric film 10 and mesa top face 11. This semiconductor laser device 20 has facets which are cleaved perpendicularly to the long side of the laser resonator.

Literature relating to this prior art includes Japanese Patent Laid-open No. 244568/2001 and JP-A No.210915/2001.

The above-mentioned conventional semiconductor laser device 20 has difficulty in providing high power output because there is a considerable catastrophic optical damage (COD) to the resonator's facet for optical output. Therefore, in order to enable high power output of the semiconductor laser device 20, it is necessary to prevent COD to the optical output facet of a resonator having a quantum well active layer. Here, COD refers to a phenomenon that laser light is absorbed on the optical output facet 14 and the generated heat melts and damages the facet and its vicinity.

As a means for preventing COD, a window structure has been suggested in which some impurity is doped near the facet to widen the band gap in the vicinity of the facet. This structure is intended to reduce absorption of laser light with a wider band gap near the facet. In order to realize such a window structure, it is necessary to use an adequate impure element and an adequate method of doping it, which, however, are very difficult to determine. There is also another problem: the impurity doped for the purpose of making a window structure might absorb laser light. Furthermore, in some cases, the window structure does not sufficiently suppress shrinkage of the band gap in the vicinity of the active layer facet.

With this background, as a consequence of many efforts to solve the above problem, the mechanism for deterioration in the COD level in the semiconductor laser device 20 has been found. In that mechanism, the stress of a film above the active layer 3, for example, the dielectric film 10 or electrode film 12, causes a tensile strain on the facet of an active region 17 of the active layer 3, which shrinks the band gap on the facet of the active region 17 and thus encourages absorption of laser light on the facet of the active region. In the semiconductor laser device 20, the band gap for the active layer 3 is determined to decide the output light wavelength depending on the application purpose. Besides, materials for the semiconductor substrate, active layer 3 and cladding layers are determined so as to obtain the required band gap. However, the required band gap is sometimes not obtained because the band gap varies with the stress of the dielectric film 10 and electrode film 12. This occurs more often in facets than inside the semiconductor laser device 20.

Referring to FIG. 18, an explanation is given below in more detail of the mechanism which causes tensile strain on the facet of the active region 17 of the active layer 3 as mentioned above.

The following is a case that the dielectric film 10, made by thermal CVD, and the electrode film 12, made by vacuum evaporation, have tensile strains. Here, stress in the regions of the dielectric film 10 and electrode film 12 which do not cover the mesa structure 8 is referred to as tensile stress A while stress in their regions which cover the surface of the mesa structure 8 is referred to as tensile stress B. Counteraction of tensile stress A compresses the underlying portion of the active layer 3 and brings it into a state of compressive strain. On the other hand, due to the mesa structure 8, the distance between the film portion having tensile stress B and the active region 17 is long, so counteraction of tensile stress B which brings the active region 17 into a state of compressive strain is small. For this reason, tensile strain C is generated by counteraction of the compressive strains of the portions of the active layer 3 which are on both sides of the active region 17. This is a mechanism where by tensile strain C is generated in the active region 17 when films 10 and 12 with tensile stress lie above the active layer 13.

An object of the present invention is to provide a semiconductor laser device which ensures high yield, high reliability and high power output, by decreasing the tensile strain in the active region to improve the COD level.

SUMMARY OF THE INVENTION

In order to achieve the above object, the present invention provides a semiconductor laser device which comprises: a semiconductor crystal-growing portion having an active layer for conversion of electric energy into light energy and a mesa structure protruding on the one side; an electrode film which is electrically connected with the top face of the mesa structure; and a dielectric film which is located nearer to the semiconductor crystal-growing portion than the electrode film. In the device, at least either of the electrode film or the dielectric film has a tensile strain and stretches sideward from the mesa structure and there is a strain control film which is polymerized with the electrode film part or dielectric film part stretching sideward from the mesa structure and has a compressive stress.

DETAILED DESCRIPTION OF THE PREFERRED EMBODIMENTS

Next, preferred embodiments of the present invention will be described referring to the accompanying drawings.

Figure 1:
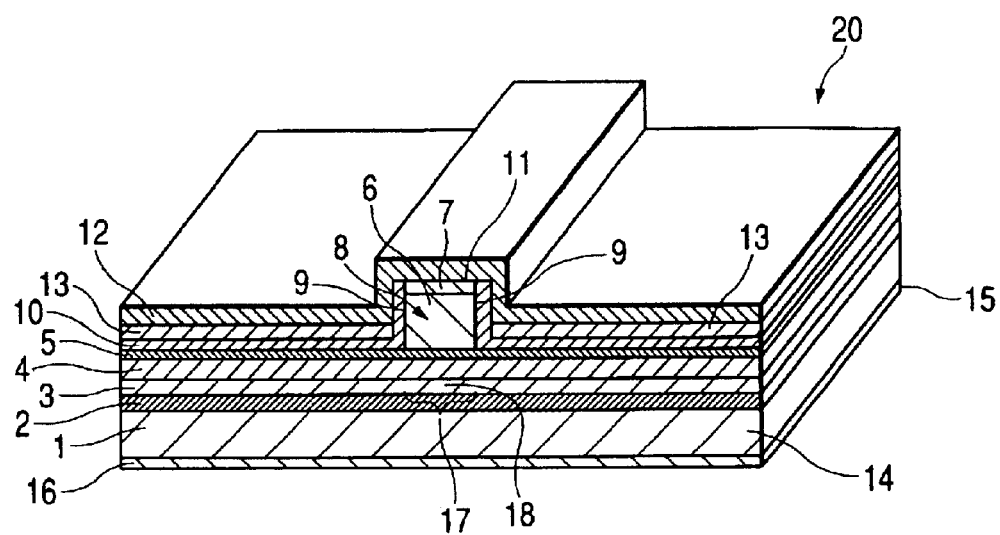
FIG. 1 is a perspective view showing a semiconductor laser device according to a first embodiment of the present invention.
Figure 2:
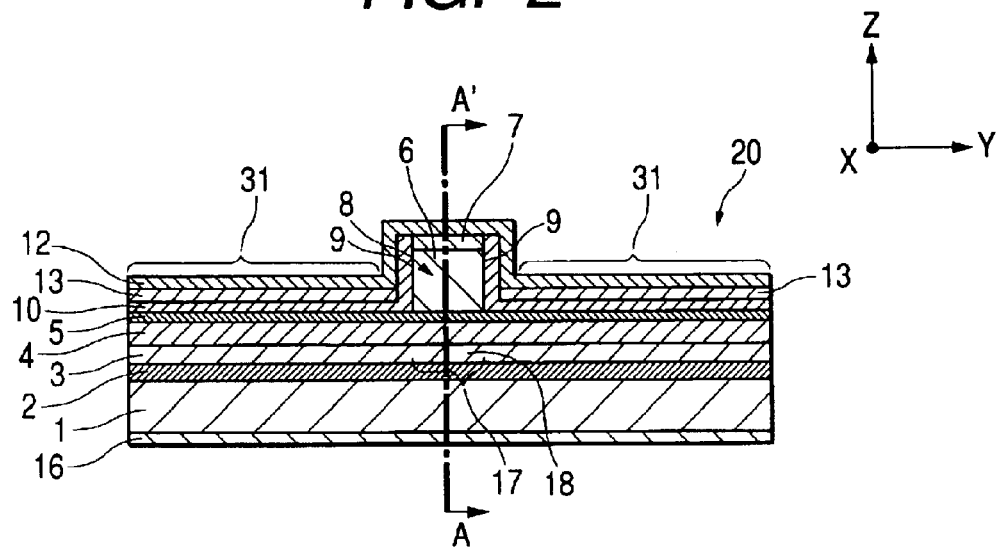
FIG. 2 is a front view of the same semiconductor laser device.
Figure 3:
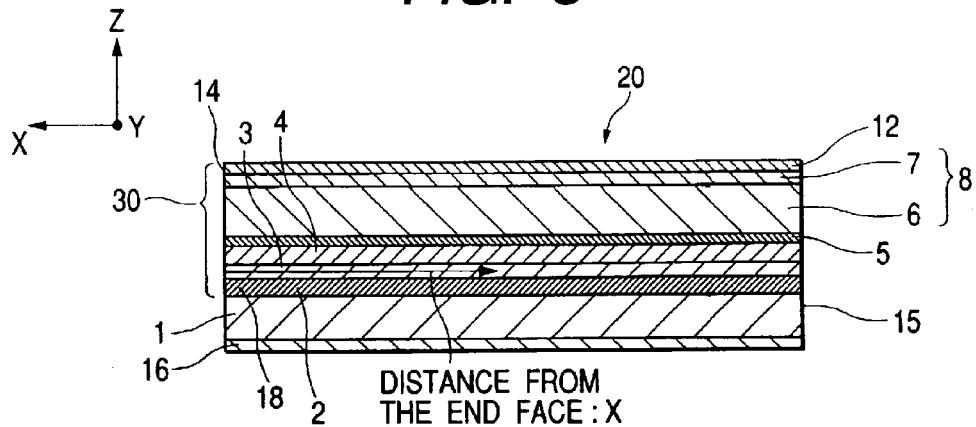
FIG. 3 is a sectional view taken by the line A–A' in FIG. 2.
Figure 4:
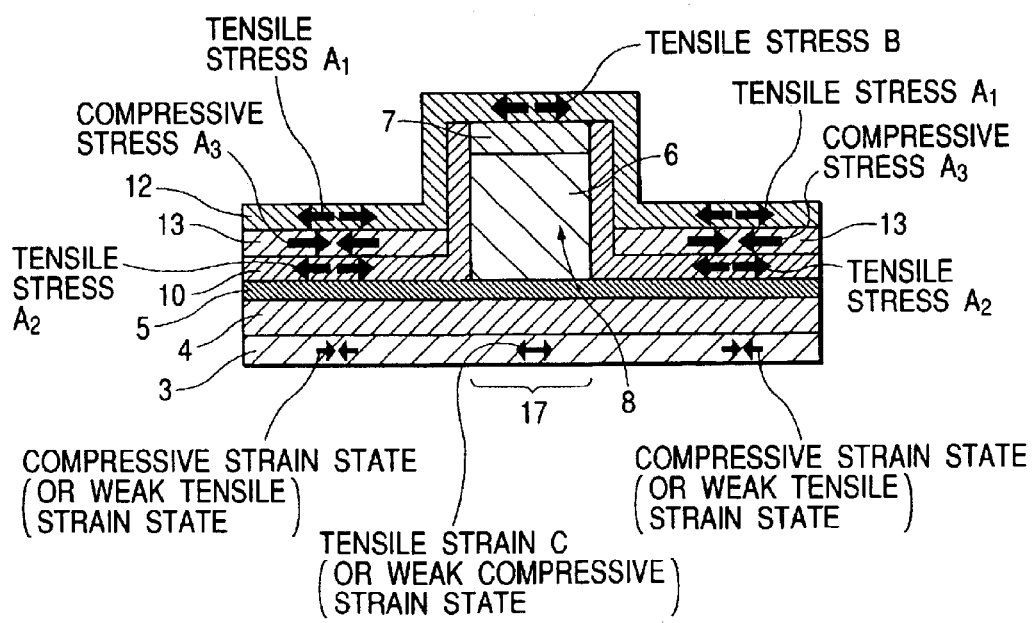
FIG. 4 is a front view of the substantial part of the same semiconductor laser device.
Figure 5:
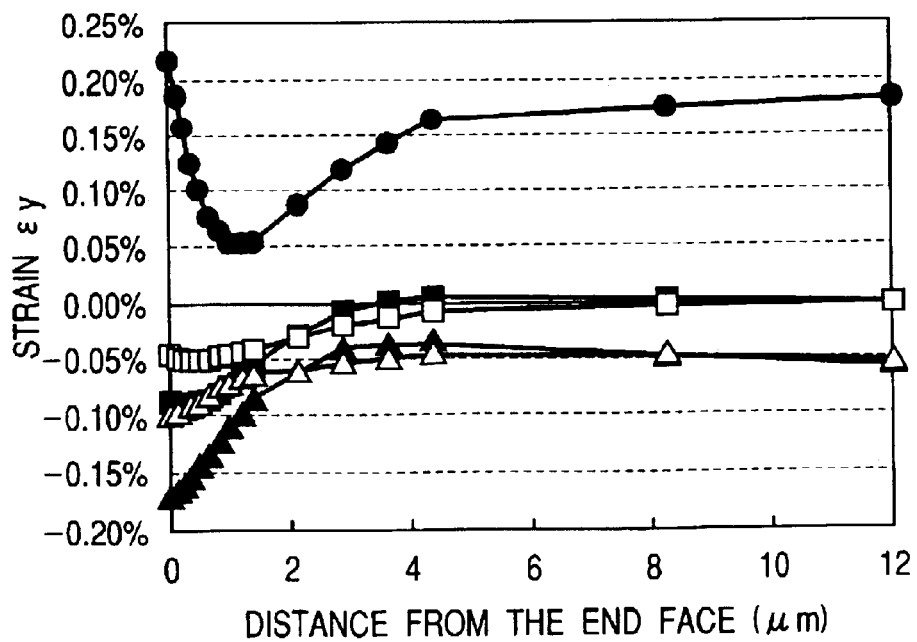
FIG. 5 is a graph showing strain distribution in the same semiconductor laser device and the conventional one.
Figure 6:
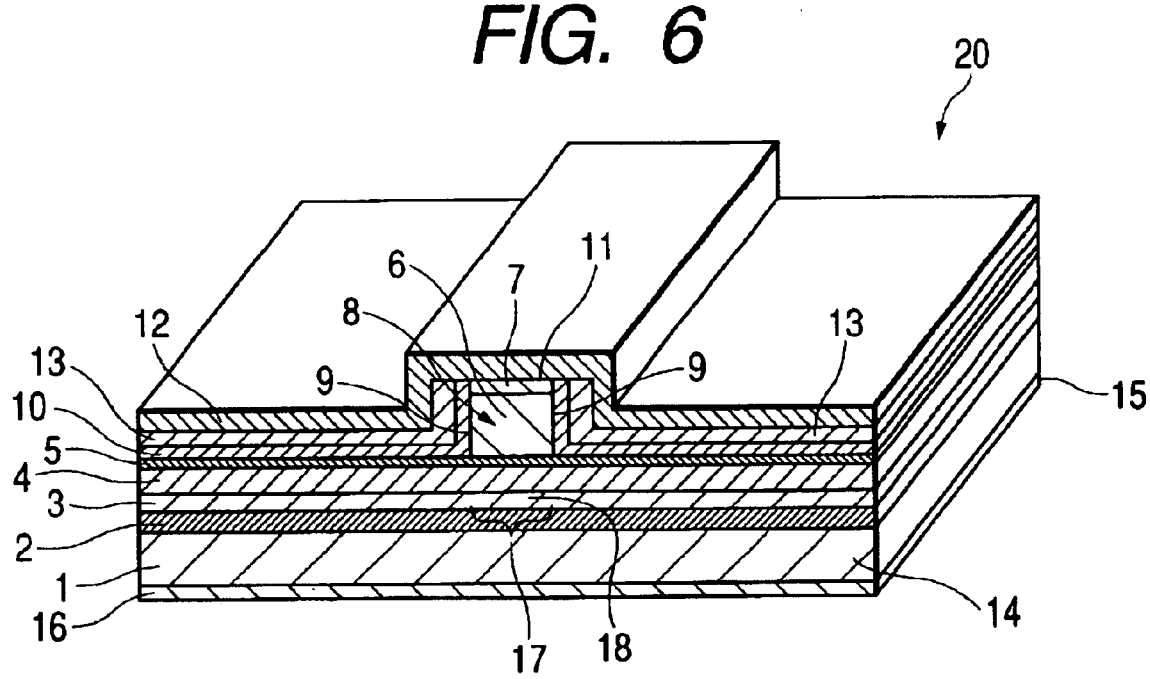
FIG. 6 is a perspective view showing a variation of the semiconductor laser device shown in FIG. 1.
Figure 7:
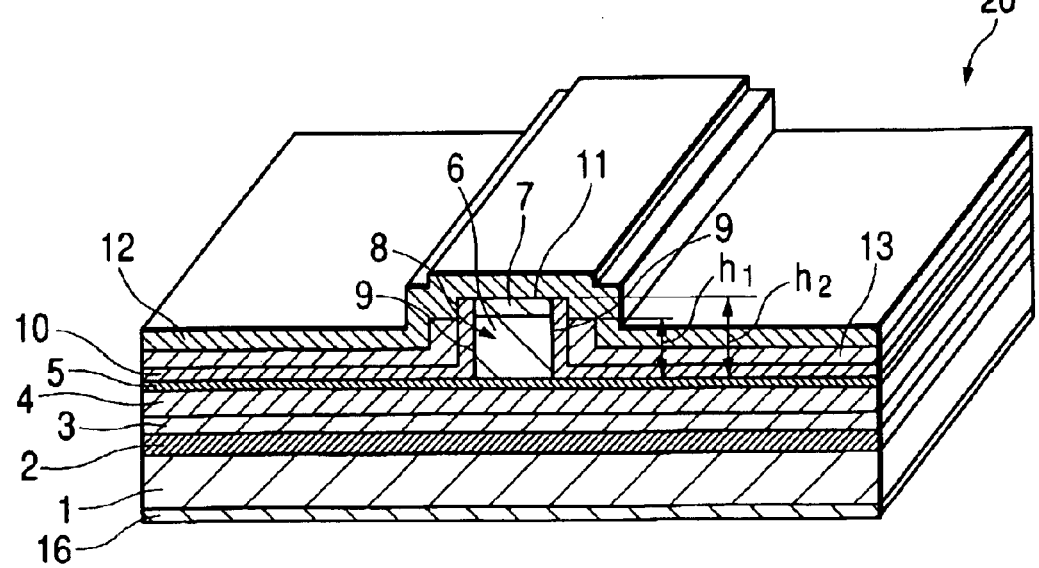
FIG. 7 is a perspective view showing another variation of the semiconductor laser device shown in FIG. 1.

Referring to FIG. 1 to FIG. 7, a first embodiment of the present invention is described below. FIG. 1 is a perspective view showing a semiconductor laser device according to a first embodiment of the present invention; FIG. 2 is a front view of the same semiconductor laser device; FIG. 3 is a sectional view taken by the line A–A' in FIG. 2; FIG. 4 is a front view of the substantial part of the same semiconductor laser device; and FIG. 5 is a graph showing strain distribution in the same semiconductor laser device and the conventional one. FIG. 6 and FIG. 7 are perspective views showing variations of the semiconductor laser device shown in FIG. 1. In FIGS. 1, 2, 6 and 7, the facets are indicated by hatchings for the purpose of easy identification of each of different layers but the hatchings do not mean that they are cross sections. The same is true of FIGS. 8, 9, 11, 13, 14, 17 and 18 which will be explained later. The same reference numerals in all the figures, including the ones related to the prior art, represent the same elements or equivalent elements.

A semiconductor laser device 20 comprises a substrate 1, a semiconductor crystal-growing portion 30, a dielectric film 10, electrode films 12, 16 and strain control film 13 and has facets 14, 15 which are cleaved perpendicularly to the long side of a laser resonator. A semiconductor crystal-growing portion 30 is formed on the one side of the substrate 1 and an electrode film 16 is formed on the other side of the substrate 1.

The semiconductor crystal-growing portion 30 has an active layer 3 to convert electrical energy into light energy and also has a mesa structure 8 protruding on the one side. Specifically, in the semiconductor crystal-growing portion 30, a first cladding layer 2, an active layer 3, a second cladding layer 4 and an etching stop layer 5 lie on the substrate 1 one upon another in the order of mention. In the center of the etching stop layer 5 is a mesa structure 8 stretching in the longitudinal direction of the resonator. The mesa structure 8 consists of a third cladding layer 6 and a contact layer 7.

The dielectric film 10 is, for example, a silicon oxide film made by thermal CVD and has a tensile stress. This dielectric film 10 stretches from the side faces 9 of the mesa structure (hereinafter called the "mesa side faces") over the top face of the etching stop layer 5 which lies on both sides of the mesa structure, all along the length of the resonator.

The electrode film 12 is, for example, a gold film made by vacuum evaporation and has a tensile stress. This electrode film 12 stretches from the top face 11 of the mesa structure (hereinafter called the "mesa top face") to the side faces and top faces of the dielectric film 10 all along the length of the resonator. This electrode film 12 is electrically connected with the mesa top face 11.

The strain control film 13 is formed along the peripheral areas 31 of the mesa structure (hereinafter called the "mesa peripheral areas") on the surface of the electrode film 12; it is made of, for example, silicon nitride, and has a compressive stress which counterbalances the tensile strains of the dielectric film 10 and electrode film 12. This strain control film 13 lies under the lower face of the electrode film 12 in the mesa peripheral areas. Therefore, the electrode film 12 is directly polymerized with the strain control film 13 and also indirectly polymerized with the dielectric film 10. Since the strain control film 13 is polymerized with the dielectric film 10 in the vicinity of the root of the mesa structure 8 and in direct contact with the lower face of the electrode film 12, it can reduce tensile strain in the active region facet vicinity 18.

One example of application to a 1.3 .m wavelength band semiconductor laser is explained below. When an N-type semiconductor is used for the substrate 1, the metalorganic chemical vapor deposition method is used to make various layers as follows: Si-doped N-type InP (thickness 500 .m or so) for the substrate 1, Si-doped InP (thickness 2000 nm or so) for the first cladding layer 2; an InGaAlAs multiple quantum well active layer (thickness 80 nm or so) for the active layer 3; Zn-doped InP (thickness 400 nm or so) for the second cladding layer 4; InGaAlP (thickness 20 nm or so) for the etching stop layer 5; Zn-doped InP (thickness 1000 nm) for the third cladding layer 6; and Zn-doped InGaAsP (thickness 200 nm or so) for the contact layer 7. Etching is done using a resist film as a mask to make the mesa structure 8 (mesa width 1.6 .m, mesa height 2 .m or so). Furthermore, a silicon oxide film (thickness 200 nm or so) is made on the surface of the semiconductor crystal-growing portion as the dielectric film 10 by the thermal CVD method; a silicon nitride film (thickness 200 nm or so) is made as the strain control film 13 by sputtering. The mesa top face 11 is etched for electrical conductivity. As the electrode film 12, a gold film (thickness 100 nm or so) is made with titan or platinum as its base. Then, the bottom face of the substrate 1 (opposite to the semiconductor crystal-growing portion 30) is thinned by polishing until the substrate thickness becomes between 100 and 150 .m. Then, an electrode 16 (AuGe/Ni/Au, thickness 100 nm) is formed by vacuum evaporation and heat treatment. The semiconductor laser device 20 is cleaved perpendicularly to the long side of the laser resonator (resonator length 200 .m) to make facets.

This embodiment is applicable to even a dielectric film 10 and an electrode film 12 which are made by a process other than the above-mentioned process, or an electrode film 12 made of a material other than gold. In other words, this embodiment is applicable when the film 10 or 12, a film above the active layer 3, has a tensile stress.

There is a protective coating (not shown) on the cleaved facets 14 and 15 of the semiconductor laser device 20. The protective coating on the facet 14 has a low reflectance while that on the facet 15 has a high reflectance. These facet protective coatings are made of, for example, aluminum oxide, silicon nitride, silicon oxide, or amorphous silicon or a lamination of layers of these materials. The thickness of the facet protective coatings should be as follows.

For the low-reflectance facet protective coating:

$$d=\lambda/(4n)$$

For the high-reflectance facet protective coating:

$$d=\lambda/(2n)$$

where d represents a coating thickness, λ a laser oscillation wavelength, and n a refractive index for the facet film.

Therefore, when a current is supplied from the electrode film 12 to the electrode film 16 provided on the rear of the semiconductor substrate 1 (in case of P-type substrate, from the electrode film 16 to the electrode film 12), the current mostly flows through the mesa top face 11 to the active region 17 because the electrode film 12 is electrically connected only with the mesa top face 11. The electric energy of this current is converted, in the active region 17 of the active layer 3, into light, which resonates between the cleaved facets 14, 15 facing each other. Thus it is outputted as laser light from the optical output facet 14 covered by the low-reflectance protective coating.

As mentioned above, the semiconductor laser device 20 has a strain control film 13 with compressive stress. The compressive stress of the strain control film 13 reduces the tensile strain generated in the active region facet vicinity 18 and suppresses shrinkage of the band gap. In addition, light absorption in the active region facet vicinity 18 is suppressed and an improvement in the COD level is achieved so that the semiconductor laser device 20 can provide high power output. For the semiconductor laser device 20 according to this embodiment, the improvement in the COD level leads to the increase in the yield rate.

The tensile strain generated in the active region facet vicinity 18 is based on the level of strain which is generated in the active region 17 before addition of materials other than those for the semiconductor crystal-growing portion 30, such as the dielectric film 10 and electrode film 12. This is also true of other embodiments of the invention.

The mechanism whereby the tensile strain generated in the active region facet vicinity 18 decreases is explained below referring to FIG. 4. Here, in the dielectric film 10 and electrode film 12, the stresses in their regions which lie above the active layer 3 and do not cover the mesa structure 8 are referred to as tensile stress $A_1$ and tensile stress $A_2$, respectively. The stress in the region which covers the mesa surface is referred to as tensile stress B. If there was no strain control film 13, the counteractions of tensile stress $A_1$ and tensile stress $A_2$ would produce, in the active layer 3, located below them, a large compressive stress corresponding to the tensile stresses, or bring it into a compressive strain state, as mentioned earlier. However, in this embodiment, since the strain control film 13 having compressive stress $A_3$ lies below the electrode film 12 having tensile stress $A_1$ (namely on the semiconductor crystal side) and above the dielectric film 10 having tensile stress $A_2$, the tensile stresses and compressive stress are counterbalanced each other and thus the compressive strain caused by tensile stresses $A_1$ and $A_2$ is weakened or transformed into a weak tensile strain. As a consequence, counteraction of the above compressive strain decreases the tensile strain C generated in the active region 17 or brings the active region 17 into a weak compressive strain state. This suppresses shrinkage of the band gap in the active region facet vicinity 18 and also reduces light absorption in the active region facet vicinity 18, resulting in an improvement in the COD level.

Depending on the magnitudes of the tensile stresses of the dielectric film 10 and electrode film 12 located above the active layer 3, the thickness and material of the strain control film 13 with compressive stress and the method of making it may be adjusted to optimize the value of compressive stress so that the tensile strain C in the active region 17 is minimized. Or, the strain in the active region 17 can be transformed into a weak compressive strain. Particularly, the facet from which laser light is outputted has a higher optical density so it is effective for prevention of COD that the facet region is in a compressive strain state and the band gap is widened.

FIG. 1 shows that the strain control film 13 is formed on the mesa peripheral areas 31 but not on the mesa side faces 9. On the other hand, in the semiconductor laser device 20 shown in FIG. 6, the strain control film 13 extends more and covers the mesa side faces 9, which is also effective in reducing the tensile strain in the active region 17.

The distribution of strain generated in the semiconductor laser device 20 is explained below referring to FIG. 5. FIG. 5 shows calculation results obtained from analysis using the finite element method (FEM). Indium phosphor's material constants (Young's modulus, Poisson's ratio, coefficient of linear expansion) were used as the material constants for the substrate 1, first cladding layer 2, active layer 3, second cladding layer 4, etching stop layer 5 and third cladding layer 6. In practice, the cladding layers 2, 4, 6, active layer 3, and etching stop layer 5 are made of ternary or quaternary materials or the like; however, even when the material constants of indium phosphor, a binary compound, are used for the above layers, the universality of analysis results is not lost. The analysis was made under the condition that a silicon oxide dielectric film 10 and a gold electrode were used and the dielectric film 10 and the electrode film 12 had initial tensile stresses. The strain control film 13 with compressive stress was made of silicon nitride.

The material constants used in the FEM analysis are shown next in Table 1. The arrows in the table indicate ditto or "the same as the above."

Table 1

TABLE 1

| | Young's modulus (GPa) | Poisson's ratio | Coefficient of linear expansion (×10⁻⁶/° C.) | Initial stress (GPa) |
|---|---|---|---|---|
| Substrate | 104 | 0.3 | 4.56 | 0 |
| First cladding layer | . | . | . | . |
| Active layer | . | . | . | . |
| Second cladding layer | . | . | . | . |
| Etching stop layer | . | . | . | . |
| Third cladding layer | . | . | . | . |
| Dielectric film | 70 | 0.17 | 0.6 | 0.2 |
| Electrode | 82 | 0.3 | 14.2 | 0.5 |
| Film with compressive stress | 259 | 0.26 | 2.5 | −2 |

Alternatively, it is also acceptable that the substrate 1 is made of GaAs and semiconductor thin films including the first cladding layer 2, active layer 3, second cladding layer 4, etching stop layer 5 and third cladding layer 6 have other material constants. Even if the materials or material constants for the semiconductor thin films 2 to 6 and the electrode film 12 and the dielectric film 10 are different from those listed above, the strain distribution is almost the same though the strain values change. This means that addition of the strain control film 13 with compressive stress reduces the tensile strain C in the active region 17 even in different conditions.

In the semiconductor laser device 20 according to the present invention, a silicon nitride film as the strain control film 13 is formed on the dielectric film 10 of silicon oxide, so damage caused by direct transfer of the stress of the above silicon nitride to the semiconductor crystal is prevented compared with a case where there is no such silicon oxide film. In addition, since the dielectric film 10 is made of silicon oxide, a high insulation performance in the mesa peripheral areas is ensured.

Also, since a silicon oxide film is first formed as the dielectric film 10 on the semiconductor crystal and then a silicon nitride film formed as the strain control film 13 upon it, the degree of adhesion of the silicon nitride film is higher than when the silicon nitride film is formed directly on the semiconductor crystal. This prevents the film from peeling off.

In FIG. 5, the horizontal axis represents the distance from the facet 14 while the vertical axis represents strain which is generated in the active region 17. Here, the strain component is vertical strain ∈y in the Y direction of the coordinate system shown in FIGS. 2 and 3. In the graph, a positive strain value indicates a tensile strain. FIG. 5 shows calculation results for five different structures: thicknesses 360 nm and 240 nm for the strain control film 13 (thickness of the strain control film 13 on the mesa side faces 9: 0 nm), as shown in FIG. 1; thicknesses 360 nm and 240 nm for the strain control film 13, with the strain control film 13 covering the mesa side faces 9, as shown in FIG. 6; and, for comparison, a structure in which there is no strain control film 13 with compressive stress.

As apparent from FIG. 5, in the structure having no strain, control film 13, a tensile strain is generated in the active region 17; the tensile strain is particularly large in the facet vicinity. By contrast, in the structure having a strain control film 13, the tensile strain is suppressed and, in the facet vicinity, transformed into a compressive strain. In the structure with the strain control film 13 not covering the mesa side faces 9, the compressive strain in the facet vicinity is larger, which is more effective in widening the band gap. Although, in the above example, the thickness of the strain control film 13 on the mesa side faces 9 is the same as that on the mesa peripheral areas, it is also acceptable that the thicknesses are different. Also, as in the semiconductor laser device 20 shown in FIG. 7, the height of the strain control film 13, $h_1$, may be smaller than the mesa height $h_2$. When the height $h_1$, of the strain control film 13 on the mesa side faces 9 is smaller, the strain in the facet vicinity is further brought towards the compressive side, as in the case of the thickness of the strain control film 13 on the mesa side faces 9 as shown in FIG. 5.

The tensile strain in the active region 17 of the semiconductor laser device 20 in this embodiment is suppressed and smaller than in the conventional structure in which there is no film with compressive stress. Obviously, this suppresses shrinkage of the band gap in the active region facet vicinity 18 and reduces light absorption in the active region facet vicinity 18, thereby improving the COD level.

Figure 8:
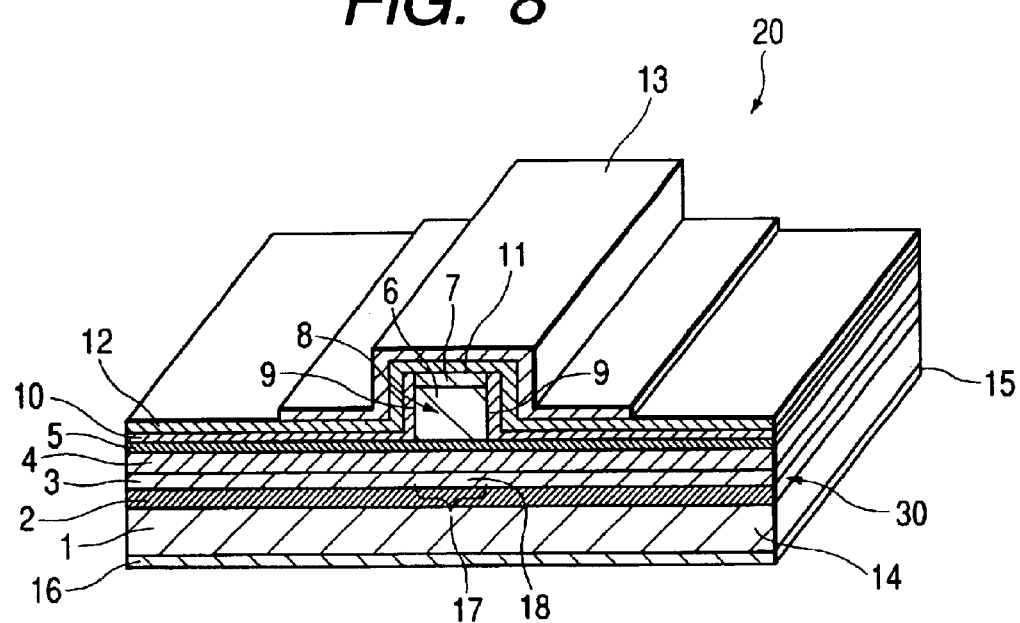
FIG. 8 is a perspective view showing a semiconductor laser device according to a second embodiment of the present invention.
Figure 9:
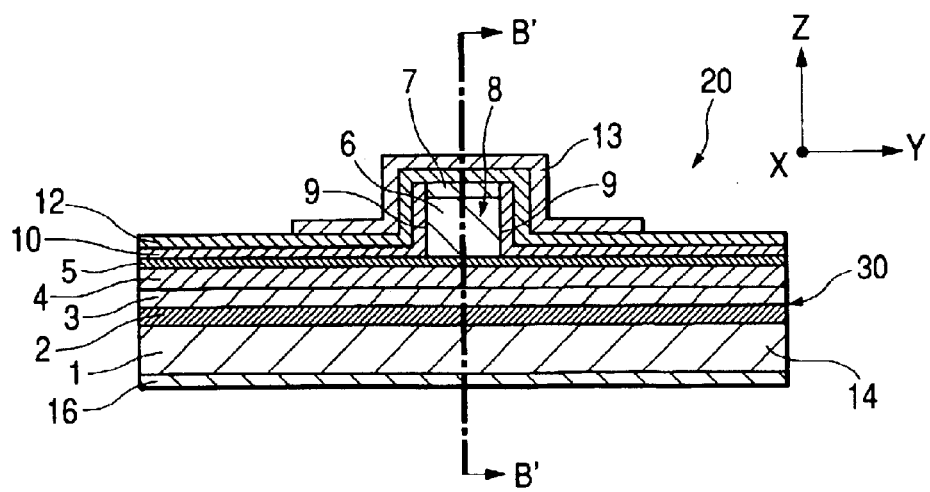
FIG. 9 is a front view of the same semiconductor laser device.
Figure 10:
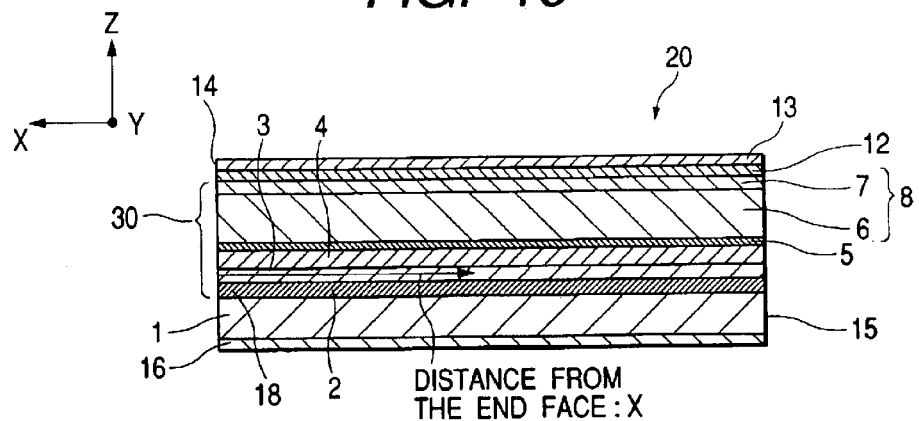
FIG. 10 is a sectional view taken by the line B–B' in FIG. 9.
Figure 11:
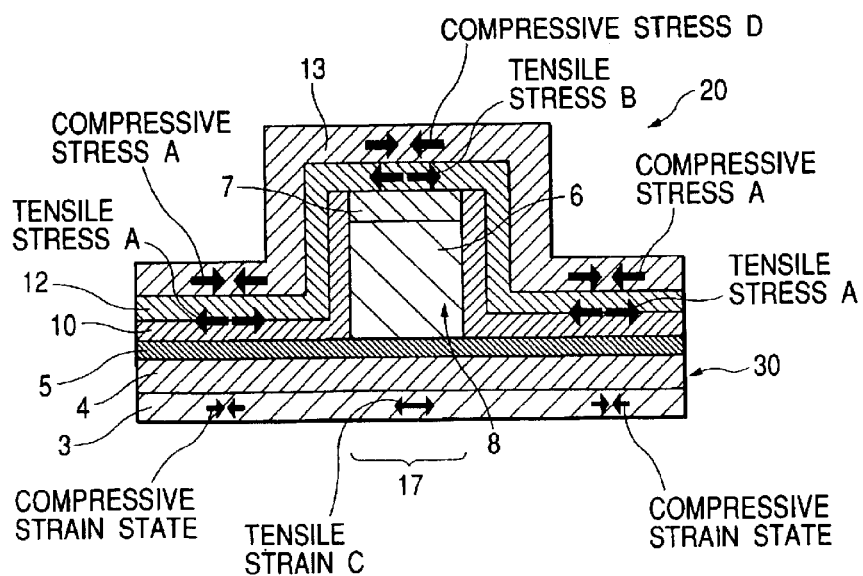
FIG. 11 is a front view of the substantial part of the same semiconductor laser device.
Figure 12:
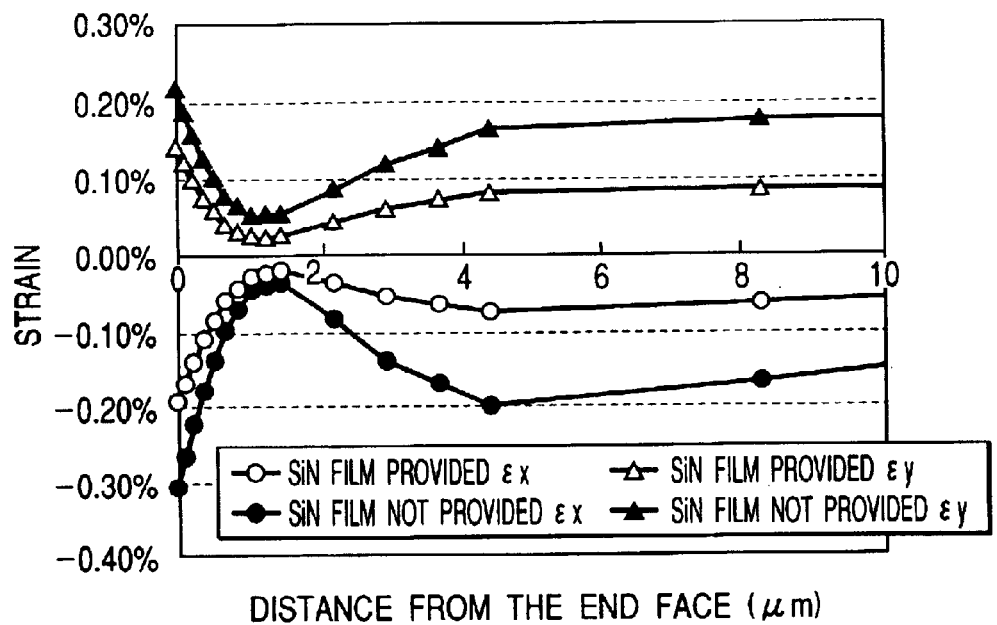
FIG. 12 is a graph showing strain distribution in the same semiconductor laser device and the conventional one.

Next, referring to FIG. 8 to FIG. 12, a second embodiment of the present invention is described. FIG. 8 is a perspective view showing a semiconductor laser device according to a second embodiment of the present invention; FIG. 9 is a front view of the same semiconductor laser device; FIG. 10 is a sectional view taken by the line B–B' in FIG. 9; FIG. 11 is a front view of the substantial part of the same semiconductor laser device; and FIG. 12 is a graph showing strain distribution in the same semiconductor laser device and the conventional one.

A semiconductor laser device 20 comprises a substrate 1, a semiconductor crystal-growing portion 30, a dielectric film 10, electrode films 12, 16 and strain control film 13 and has facets 14, 15 which are cleaved perpendicularly to the long side of a laser resonator. A semiconductor crystal-growing portion 30 is formed on the one side of the substrate 1 and an electrode film 16 is formed on the other side of the substrate 1.

The semiconductor crystal-growing portion 30 has an active layer 3 to convert electrical energy into light energy and also has a mesa structure 8 protruding on the one side.

Specifically, in the semiconductor crystal-growing portion 30, a first cladding layer 2, an active layer 3, a second cladding layer 4 and an etching stop layer 5 lie on the substrate 1 one upon another in the order of mention. In the center of the etching stop layer 5 is a mesa structure 8 stretching in the longitudinal direction of the resonator. The mesa structure 8 comprises a third cladding layer 6 and a contact layer 7.

The dielectric film 10 is, for example, a silicon oxide film made by thermal CVD and has a tensile stress. This dielectric film 10 stretches from the side faces 9 of the mesa structure (hereinafter called the "mesa side faces") over the top face of the etching stop layer 5 which lies on both sides of the mesa structure, all along the length of the resonator.

The electrode film 12 is, for example, a gold film made by vacuum evaporation and has a tensile stress. This electrode film 12 stretches from the top face 11 of the mesa structure (hereinafter called the "mesa top face") to the side faces and top faces of the dielectric film 10 all along the length of the resonator. This electrode film 12 is electrically connected with the mesa top face 11.

The strain control film 13 is made of, for example, silicon nitride, and lies on the surface of the electrode film 12 with a compressive stress which counterbalances the tensile strains of the dielectric film 10 and electrode film 12. This strain control film 13 is formed on the surface of the electrode film 12, above the mesa top face 11, mesa side faces 9 and sideward extensions of the mesa structure 8. Therefore, the strain control film 13 is directly polymerized with the electrode film 12 and also indirectly polymerized with the dielectric film 10. The strain control film 13 does not cover the whole electrode film 12 but is partially etched for electrical conductivity with the outside, so the electrode film 12 is partially exposed. Electric power can be easily supplied to the electrode film 12 through the exposed parts. Since the strain control film 13 is polymerized with the electrode film 12 and dielectric film 10 in the vicinity of the root of the mesa structure 8, it can reduce tensile strain in the active region facet vicinity 18.

One example of application to a 1.3 .m wavelength band semiconductor laser is explained below. When an N-type semiconductor is used for the substrate 1, the metalorganic chemical vapor deposition method is used to make various layers as follows: Si-doped N-type InP (thickness 500 .m or so) for the substrate 1, Si-doped InP (thickness 2000 nm or so) for the first cladding layer 2; an InGaAlAs multiple quantum well active layer (thickness 80 nm or so) for the active layer 3; Zn-doped InP (thickness 400 nm or so) for the second cladding layer; InGaAlP (thickness 20 nm or so) for the etching stop layer 5; Zn-doped InP (thickness 1000 nm) for the third cladding layer 6; and Zn-doped InGaAsP (thickness 200 nm or so) for the contact layer 7. Etching is done using a resist film as a mask to make the mesa structure 8 (mesa width 1.6 .m, mesa height 2 .m or so). Furthermore, a silicon oxide film (thickness 200 nm or so) is made on the surface of the semiconductor crystal-growing portion as the dielectric film 10 by the thermal CVD method. However, the mesa top face 11 is etched for electrical conductivity. As the electrode film 12, a gold film (thickness 100 nm or so) is made with titan or platinum for its base and a silicon nitride film with a thickness of 200 nm or so is made as the strain control film 13 by sputtering, and is partially etched for electrical conductivity. Then, the bottom face of the substrate 1 (opposite to the semiconductor crystal-growing portion 30) is thinned by polishing until the substrate thickness becomes between 100 and 150 .m. Then, an electrode 16 (AuGe/Ni/Au, thickness 100 nm) is formed by vacuum evaporation and heat treatment. The semiconductor laser device 20 is cleaved perpendicularly to the long side of the laser resonator (resonator length 200 .m) to make facets.

The presence of compressive strain in the strain control film 13 is confirmed by polishing the rear face of the substrate 1 and checking the change in the shape of the device surface before and after polishing. If the polished device surface is convex or curved upwards, it is thought that the strain control film 13 has a compressive strain.

This embodiment is applicable to even a dielectric film 10 and an electrode film 12 which are made by a process other than the above-mentioned process, or an electrode film 12 made of a material other than gold. In other words, this embodiment is applicable when the film 10 or 12, a film above the active layer 3, has a tensile stress.

There is a protective coating (not shown) on the cleaved facets 14 and 15 of the semiconductor laser device 20. The protective coating on the facet 14 has a low reflectance while that on the facet 15 has a high reflectance. These facet protective coatings are made of, for example, aluminum oxide, silicon nitride, silicon nitride, or amorphous silicon or a lamination of layers of these materials. The thickness of the facet protective coatings should be as follows.

For the low-reflectance facet protective coating:

$$d=\lambda/(4n)$$

For the high-reflectance facet protective coating:

$$d=\lambda/(2n)$$

where d represents a coating thickness, $\lambda$ a laser oscillation wavelength, and n a refractive index.

An extension of a facet protective coating may be used as the strain control film 13. When a facet protective coating is used as the strain control film 13 in this way, the manufacturing process is easier and the manufacturing cost is decreased. For suppression of tensile strain in the active layer, it is desirable that the amount of extension be 10 .m or so in the longitudinal direction of the resonator and the coating thickness be 200 nm or so.

Therefore, when a current is supplied from the electrode film 12 to the electrode film 16 provided on the rear of the semiconductor substrate 1 (in case of P-type substrate, from the electrode film 16 to the electrode film 12), the current mostly flows through the mesa top face 11 to the active region 17 because the electrode film 12 is electrically connected only with the mesa top face 11. The electric energy of this current is converted, in the active region 17 of the active layer 3, into light, which resonates between the cleaved facets 14, 15 facing each other. Thus it is outputted as laser light from the optical output facet 14 covered by the low-reflectance protective coating.

As mentioned above, the semiconductor laser device 20 has a strain control film 13 with compressive stress. The compressive stress of the strain control film 13 reduces the tensile strain generated in the active region facet vicinity 18 and suppresses shrinkage of the band gap. In addition, light absorption in the active region facet vicinity 18 is suppressed and an improvement in the COD level is achieved so that the semiconductor laser device 20 can provide high power output. For the semiconductor laser device 20 according to this embodiment, the improvement in the COD level leads to the increase in the yield rate.

The mechanism whereby the tensile strain generated in the active region facet vicinity 18 decreases is explained below referring to FIG. 11. Here, in the dielectric film 10 and electrode film 12, the stress in their regions which lie above the active layer 3 and do not cover the mesa structure 8 is referred to as tensile stress A and the stress in the region which covers the mesa surface is referred to as tensile stress B. If there was no strain control film 13, the counteractions of tensile stress A would produce, in the active layer 3, located below them, a large compressive stress corresponding to the tensile stress or bring it into a compressive strain state, as mentioned earlier. However, in this embodiment, since the strain control film 13 having a compressive stress lies over the electrode film 12 having a tensile stress, the tensile stress and compressive stress are counterbalanced each other and thus the compressive strain in the active layer 3 which is caused by tensile stress A is weakened. As a consequence, counteraction of the above compressive strain decreases the tensile strain C generated in the active region 17. This suppresses shrinkage of the band gap in the active region facet vicinity 18 and also reduces light absorption in the active region facet vicinity 18, resulting in an improvement in the COD level.

Depending on the magnitudes of the tensile stresses of the dielectric film 10 and electrode film 12 located above the active layer 3, the thickness and material of the strain control film 13 with compressive stress and the method of making it can be adjusted to optimize the value of compressive stress so that the tensile strain C in the active region 17 is minimized.

The distribution of strains generated in the semiconductor laser device 20 is explained below referring to FIG. 12. FIG. 12 shows calculation results obtained from analysis using the finite element method (FEM). The material constants used for this FEM analysis are the same as those used in the first embodiment.

In FIG. 12, the horizontal axis represents the distance from the facet 14 while the vertical axis represents strain which is generated in the active region 17. Here, the strain components are vertical strains $\in x$ and $\in y$ in the X and Y directions of the coordinate system shown in FIGS. 9 and 10. In the graph, a positive strain value indicates a tensile strain. For comparison, FIG. 12 also shows calculation results for a structure in which there is no strain control film 13 with compressive stress.

As apparent from FIG. 12, tensile strain C in the active region 17 of the semiconductor laser device 20 in this embodiment is smaller than in the conventional structure having no film with compressive stress. Obviously, this suppresses shrinkage of the band gap in the active region facet vicinity 18 and also reduces light absorption in the active region facet vicinity 18, resulting in an improvement in the COD level.

Figure 13:
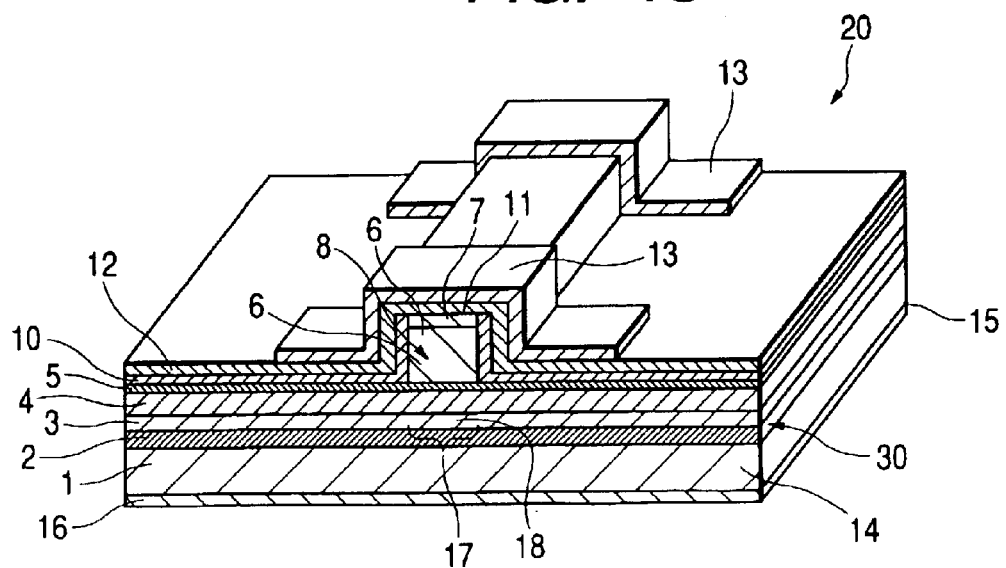
FIG. 13 is a perspective view showing a semiconductor laser device according to a third embodiment of the present invention.

Next, referring to FIG. 13, a third embodiment of the present invention is described. FIG. 13 is a perspective view showing a semiconductor laser device according to a third embodiment of the present invention. This embodiment is different from the second embodiment in the points given below but is basically the same in other points as the second embodiment.

In this embodiment, strain control films 13 with compressive stress are provided on the electrode film 12 only near the facets 14 and 15. As explained earlier, deterioration in the COD level in the semiconductor laser device 20 is caused by shrinkage of the band gap in the active region facet vicinity 18; and as apparent from FIG. 12, the strain which causes such deterioration is larger in the active region facet vicinity 18 than in other regions. Therefore, when strain control films 13 with compressive stress are provided on the electrode film 13 only near the facets 14 and 15 as in this embodiment, the strain in the active region facet vicinity 18 can be effectively reduced to improve the COD level and at the same time electric power is more easily supplied to the electrode film 12 thanks to the increase in the exposed area of the electrode film 12.

Even if a strain control film 13 is formed only near either the facet 14 or 15, there will be an improvement in the COD level. However, for further improvement in the COD level, it is desirable that films 13 with compressive stress be provided near both the facets 14 and 15 as in this embodiment.

Figure 14:
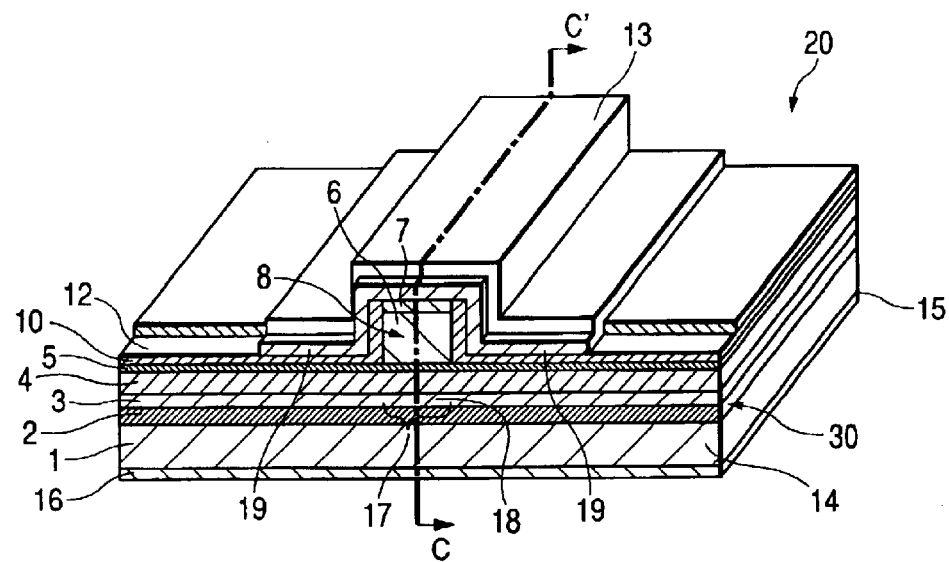
FIG. 14 is a perspective view showing a semiconductor laser device according to a fourth embodiment of the present invention.
Figure 15:
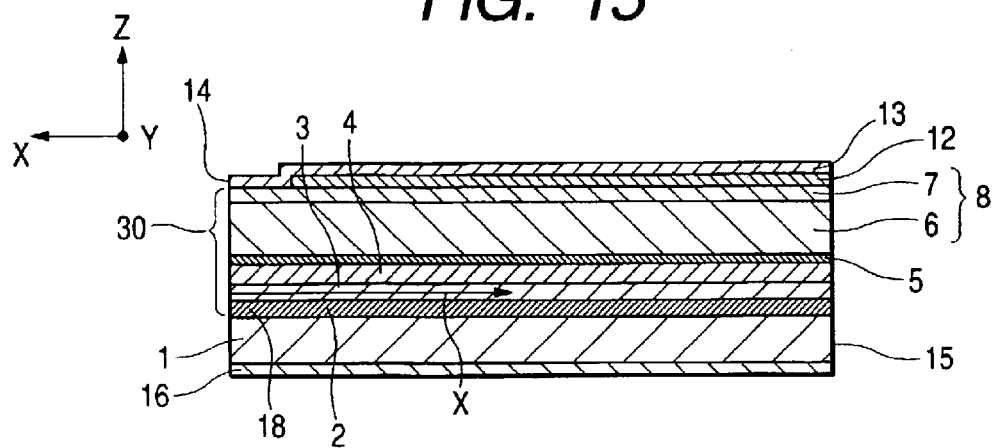
FIG. 15 is a sectional view taken by the line C–C' in FIG. 14.
Figure 16:
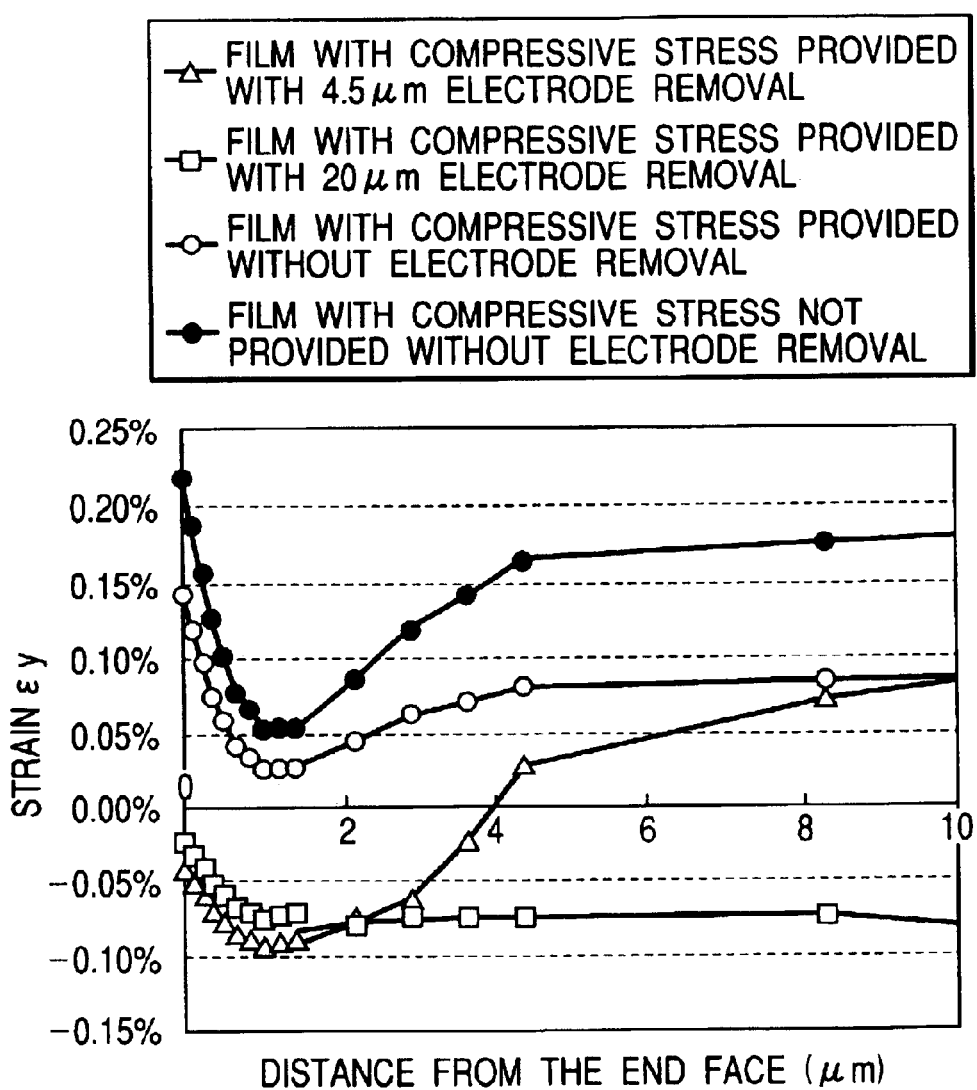
FIG. 16 is a graph showing strain distribution device in the same semiconductor laser device and the conventional one.

Next, referring to FIG. 14 to FIG. 16, a fourth embodiment of the present invention is described. FIG. 14 is a perspective view showing a semiconductor laser device according to a fourth embodiment of the present invention; FIG. 15 is a sectional view taken by the line C–C' in FIG. 14; FIG. 16 is a graph showing strain distribution in the same semiconductor laser device and the conventional one. This embodiment is different from the second embodiment in the points given below but is basically the same in other points as the second embodiment.

In this embodiment, the electrode film 12 is partially removed in the vicinity of the facet 14 of the semiconductor laser device 20. The strain control film 13 with compressive stress is provided in a way to embrace the vicinity of the facet 14 of the mesa structure 8. This strain control film 13 lies over the dielectric film 10's parts 19 which correspond to the mesa bottom peripheral areas. This strain control film 13 is, for example, a silicon nitride film made by sputtering. The silicon nitride film can have a compressive stress as an initial stress when it is made by a sputtering process with low pressure and high energy. Such a strain control film 13 will reduce the strain in the active region facet vicinity 18 more effectively, thereby further improving the COD level.

The distribution of strain generated in the active region 17 of the semiconductor laser device 20 in this embodiment is explained referring to FIG. 16. This strain distribution has been obtained from FEM analysis. The material constants used for the FEM analysis are as shown in Table 1, as in the case of the second embodiment. In FIG. 16, the horizontal axis represents the distance from the facet 14 while the vertical axis represents the strain value. Here, the strain component is vertical strain ∈y in the Y direction of the coordinate system shown in FIG. 15. In the graph, a positive strain value indicates a tensile strain.

FIG. 16 shows calculation results for four different structures: a structure in which there is a film with compressive stress and 4.5. electrode film part from the facet is removed, a structure in which there is a film with compressive stress and 20 .m electrode film part from the facet is removed, and for comparison, a structure in which there is a strain control film 13 with compressive stress and any part of the electrode film part from the facet is not removed, and a structure in which there is no strain control film 13 with compressive stress and any part of the electrode film from the facet is not removed.

As apparent from FIG. 16, the tensile strain generated in the active region facet vicinity 18 of the semiconductor laser device 20 in this embodiment is remarkably reduced by removing part of the electrode film 12 near the facet 14 and providing a strain control film 13 with compressive stress. The reduction in tensile strain in the active region facet vicinity 18 suppresses shrinkage of the band gap in that region. This reduces light absorption in the active region facet vicinity 18 and substantially improves the COD level so that the semiconductor laser device 20 can provide high power output.

The above calculation results concern a 1.6 .m-wide mesa structure 8. Although the strain value varied depending on the mesa structure width, the strain distribution remains almost unchanged. This means that addition of the strain control film 13 with compressive stress substantially reduces the tensile strain in the active region, regardless of the mesa structure width.

In the example shown, the electrode film 12 is partially removed only near the facet 14. However, it may be partially removed near both the facets 14 and 15, which will further reduce COD. Also, the same effect can be achieved by thinning the electrode film 12 near the facet(s), for example, to 30 nm or so instead of partially removing the electrode film 12 near the facet(s).

Figure 17:
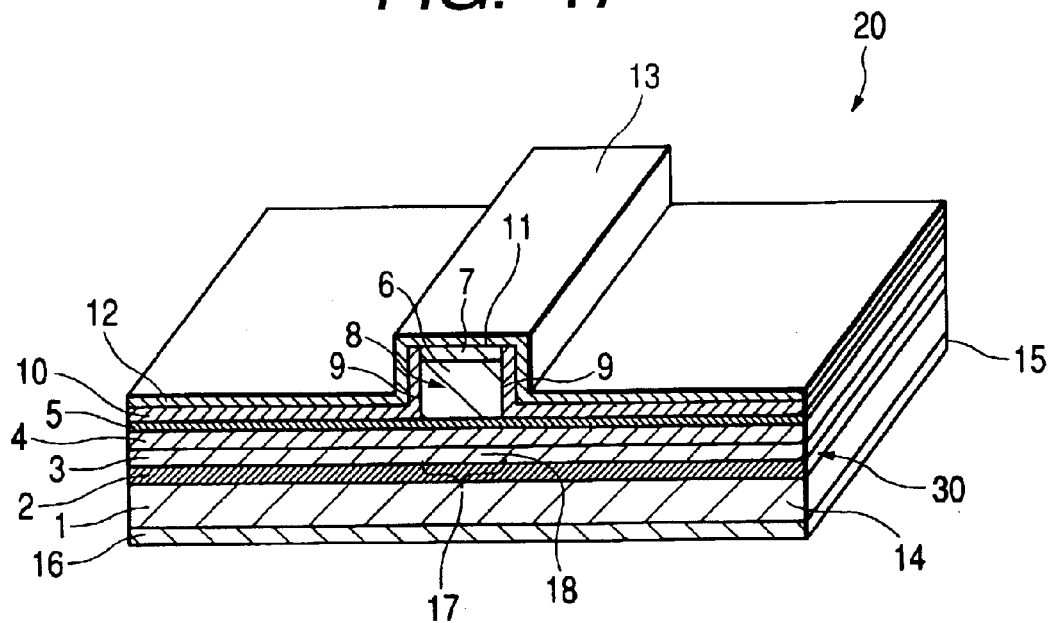
FIG. 17 is a perspective view showing a semiconductor laser device according to a fifth embodiment of the present invention.
Figure 18:
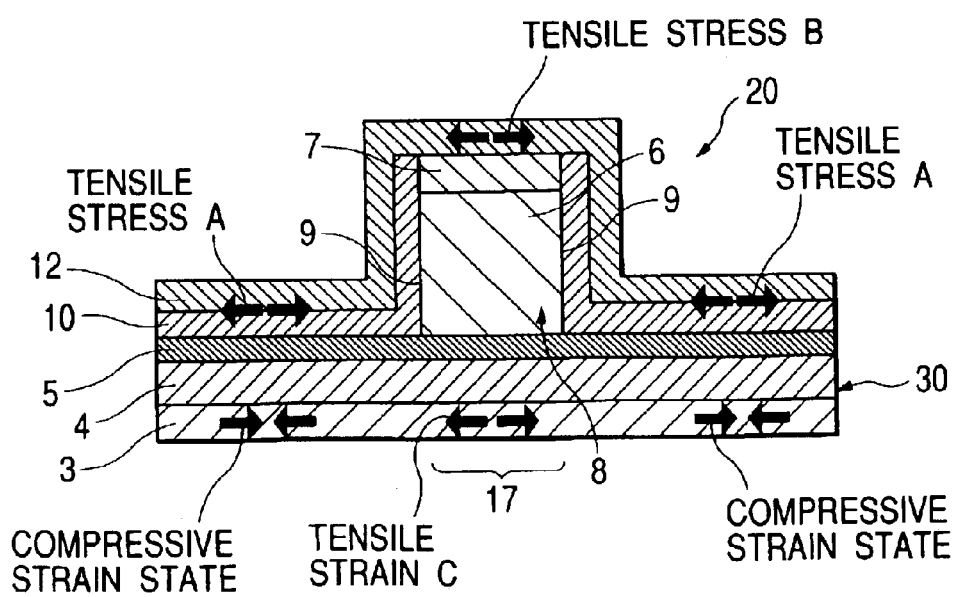
FIG. 18 is a front view of the substantial part of the conventional semiconductor laser device.

Next, referring to FIG. 17, a fifth embodiment of the present invention is described. FIG. 17 is a perspective view showing a semiconductor laser device according to a fifth embodiment of the present invention. This embodiment is different from the second embodiment in the points given below but is basically the same in other points as the second embodiment.

In this embodiment, while the dielectric film 10 is made to have a tensile stress, the electrode film 12 is made to have a compressive stress. The tensile stress of the dielectric film 10 and the compressive stress of the electrode film 12 are counterbalanced, which weakens the compressive strain of the active layer 3 caused by the tensile stress of the dielectric film 10. As a consequence, counteraction of the compressive strain reduces the tensile strain generated in the active region 17. This suppresses shrinkage of the band gap in the active region facet vicinity 18 and reduces light absorption in the active region facet vicinity 18, resulting in an improvement in the COD level. In this embodiment, since the dielectric film 10 and electrode film 12 are to have mutually contrary stresses, their materials and film making method are limited; however, because the strain control film 13 is not needed, the manufacturing const is decreased.

The same effect can be achieved even when the dielectric film 10 is made to have a compressive stress and the electrode film 12 is made to have a tensile stress.

As discussed so far, according to the present invention, the tensile strain in the active region is decreased to improve the COD level so that a semiconductor laser device which ensures high yield, high reliability and high power output can be provided.

What is claimed is:

1. A semiconductor laser device comprising:
   a semiconductor crystal-growing portion having an active layer for conversion of electric energy into light energy and a mesa structure protruding on one side of the active layer; and
   an electrode film which is electrically connected with the top face of the mesa structure,
   the electrode film having a tensile strain and stretching sideward from the mesa structures,
   wherein there is a strain control film which is polymerized with the electrode film part stretching sideward from both sides of the mesa structure and has a compressive stress.

2. The semiconductor laser device as defined in claim 1, wherein there is a dielectric film which is located nearer to the semiconductor crystal-growing portion than the electrode film, and each of the electrode film and the dielectric film has a tensile strain and stretches sideward from both sides of the mesa structure.

3. The semiconductor laser device as defined in claim 1, wherein the strain control film is formed on the surface of the electrode film in a manner to partially expose the electrode film.

4. The semiconductor laser device as defined in claim 1, wherein the strain control film is polymerized, in the vicinity of the root of the mesa structure, with the electrode film part stretching sideward from both sides of the mesa structure.

5. A semiconductor laser device comprising:
   a semiconductor crystal-growing portion having an active layer for conversion of electric energy into light energy and a mesa structure protruding on one side of the active layer; and
   an electrode film which is electrically connected with the top face of the mesa structure, and has a tensile strain, stretching sideward from both sides of the mesa structure,
   wherein there is a strain control film which is polymerized on the side nearer to the semiconductor crystal-growing portion than the electrode film part stretching sideward from both sides of the mesa structure and has a compressive stress.

6. The semiconductor laser device as defined in claim 5, wherein there is a dielectric film which is located nearer to the semiconductor crystal-growing portion than the electrode film and the dielectric film both stretch sideward from both sides of the mesa structure and the strain control film lies between the electrode film and the dielectric film.

7. A semiconductor laser device comprising:

a semiconductor crystal-growing portion having an active layer for conversion of electric energy into light energy and a mesa structure protruding on one side of the active layer; and an electrode film which is electrically connected with the top face of the mesa structure, and stretches sideward from both sides of the mess structure.

in which the electrode film has a tensile strain, and facets cleaved perpendicularly to the direction of emission, wherein a laser resonator is defined by the facets, wherein there is a strain control film which is polymerized at least in the vicinity of the cleaved facets of the electrode film part stretching sideward from the both sides of the mesa structure and has a compressive stress.

8. The semiconductor laser device as defined in claim 7, wherein the strain control film lies all along the length of the laser resonator in the vicinity of the root of the mesa structure.

9. The semiconductor laser device as defined in claim 7, wherein the strain control film is formed only in the vicinity of the cleaved facets.

10. A semiconductor laser device comprising:

a semiconductor crystal-growing portion having an active layer for conversion of electric energy into light energy and a mesa structure protruding on one side of the active layer;

an electrode film which is electrically connected with the top face of the mesa structure, and stretches sideward from both sides of the mesa structure; and a dielectric film which is located nearer to the semiconductor crystal-growing portion than the electrode film and has a tensile strain, stretching sideward from both sides of the mesa structure, the semiconductor laser device having facets cleaved perpendicularly to the direction of emission, wherein a laser resonator is defined by the facets, wherein the electrode film is partially removed or thinned in the vicinity of the laser light output side facet and there is a strain control film which is polymerized on the top face of the dielectric film part stretching sideward from both sides of the mesa structure in the facet vicinity and has a compressive stress.

11. The semiconductor laser device as defined in claim 1, wherein the strain control film is comprised of silicon nitride.

12. A semiconductor laser device comprising:

a semiconductor crystal-growing portion having an active layer for conversion of electric energy into light energy and a mesa structure protruding on one side of the active layer;

an electrode film which is electrically connected with the top face of the mesa structure, stretching sideward from both sides of the mesa structure; and a dielectric film which is located nearer to the semiconductor crystal-growing portion than the electrode film and polymerized with the electrode film, stretching, sideward from both sides of the mesa structure.

wherein the electrode film part and dielectric film part which stretch sideward from the mesa structure have mutually contrary stresses, namely a tensile stress and a compressive stress.

13. A semiconductor laser device comprising:

a semiconductor crystal-growing portion having an active layer for conversion of electric energy into light energy and a mesa structure protruding on one side of the active layer;

an electrode film which is electrically connected with the top face of the mesa structure;

a dielectric film which is located nearer to the semiconductor crystal-growing portion than the electrode film; and a protective coating formed on a facet cleaved perpendicularly to the direction of emission, wherein a laser resonator is defined by facets, at least either of the electrode film and the dielectric film having a tensile strain and stretching sideward from the mesa structure, wherein an extension of the protective coating serves as a strain control film which is polymerized with the electrode film part or dielectric film part stretching sideward from both sides of the mesa structure and has a compressive stress.

* * * * *